US011729903B2

(12) United States Patent
Harada et al.

(10) Patent No.: US 11,729,903 B2
(45) Date of Patent: Aug. 15, 2023

(54) RADIO FREQUENCY MODULE AND COMMUNICATION DEVICE

(71) Applicant: Murata Manufacturing Co., Ltd., Nagaokakyo (JP)

(72) Inventors: Shun Harada, Nagaokakyo (JP); Yukiya Yamaguchi, Nagaokakyo (JP)

(73) Assignee: MURATA MANUFACTURING CO., LTD., Nagaokakyo (JP)

(*) Notice: Subject to any disclaimer, the term of this patent is extended or adjusted under 35 U.S.C. 154(b) by 0 days.

(21) Appl. No.: 17/224,146

(22) Filed: Apr. 7, 2021

(65) Prior Publication Data

US 2021/0329778 A1 Oct. 21, 2021

(30) Foreign Application Priority Data

Apr. 17, 2020 (JP) ................................ 2020-073978

(51) Int. Cl.

| | |
|---|---|
| ***H05K 1/02*** | (2006.01) |
| ***H03F 3/24*** | (2006.01) |
| ***H04B 1/40*** | (2015.01) |

(52) U.S. Cl.

CPC ........... *H05K 1/0243* (2013.01); *H03F 3/245* (2013.01); *H04B 1/40* (2013.01); *H05K 2201/1006* (2013.01); *H05K 2201/10098* (2013.01)

(58) Field of Classification Search

CPC ......... H05K 1/181; H05K 2201/10015; H05K 5/0095; H05K 9/00; H05K 999/99; H05K 1/0243; H05K 2201/10098; H05K 1/141; H05K 1/183; H05K 1/0206; H05K 1/0218; H05K 3/368; H05K 1/0306; H05K 1/144; H05K 2201/10477; H05K 3/0061; H05K 3/30; H05K 3/4629; H05K 7/20409; H05K 1/0272; H05K 1/11; H05K 1/142; H05K 1/16; H05K 1/162; H05K 1/184; H05K 2201/0129; H05K 2201/10189;

(Continued)

(56) References Cited

U.S. PATENT DOCUMENTS 6,434,016 B2 * 8/2002 Zeng ...................... H05K 1/181 361/764
2006/0099390 A1 * 5/2006 Sugiyama ............ H03H 9/1085 428/209

(Continued)

FOREIGN PATENT DOCUMENTS

JP H11-168185 A 6/1999
JP 2005-57577 A 3/2005

(Continued)

OTHER PUBLICATIONS

Office Action dated Mar. 14, 2022 in Korean Patent Application No. 10-2021-0034446, 9 pages.

*Primary Examiner* — Ajibola A Akinyemi
(74) *Attorney, Agent, or Firm* — Xsensus LLP

(57) ABSTRACT

A radio frequency module includes: a module board; a first electronic component and a second electronic component that are disposed apart from each other on the module board; and a third electronic component that is electrically connected to both the first electronic component and the second electronic component, and is disposed extending across the first electronic component and the second electronic component.

20 Claims, 8 Drawing Sheets

(58) Field of Classification Search
CPC ... H05K 2203/1311; H05K 2203/1327; H05K 2203/1572; H05K 3/284
USPC .......................................................... 455/90.2
See application file for complete search history.

(56) References Cited

U.S. PATENT DOCUMENTS

| | | | | |
|---|---|---|---|---|
| 2014/0029201 | A1* | 1/2014 | Yang | H01L 24/19 361/813 |
| 2015/0181708 | A1* | 6/2015 | Ryu | H05K 1/181 361/728 |
| 2016/0323045 | A1* | 11/2016 | Hernandez | H04B 17/104 |

FOREIGN PATENT DOCUMENTS

| | | | |
|---|---|---|---|
| JP | 2018-137522 | A | 8/2018 |
| KR | 10-2019-0040041 | A | 4/2019 |
| WO | 2015/098793 | A1 | 7/2015 |
| WO | 2018/168500 | A1 | 9/2018 |

* cited by examiner

RADIO FREQUENCY MODULE AND COMMUNICATION DEVICE

CROSS-REFERENCE TO RELATED APPLICATION

The present application is based on and claims priority of Japanese Patent Application No. 2020-073978 filed on Apr. 17, 2020. The entire disclosure of the above-identified application, including the specification, drawings and claims is incorporated herein by reference in its entirety.

TECHNICAL FIELD

The present disclosure relates to radio frequency (RF) modules and communication devices.

BACKGROUND

In mobile communication apparatuses such as mobile phones, the arrangement of circuit elements included in radio frequency front-end circuits is becoming complex, particularly with developments in multiband technologies.

Japanese Unexamined Patent Application Publication No. 2018-137522 discloses an RF module into which multiple electronic components such as power amplifiers, low-noise amplifiers, and filters are packaged.

SUMMARY

Technical Problems

However, as recognized by the present inventors, with the above conventional technology, multiple electronic components are integrated and the interconnection of the components becomes complexed due to the miniaturization of a module. Accordingly, mismatching loss due to wiring loss and variation in wiring may increase.

In view of this, the present disclosure provides radio frequency modules and communication devices that can achieve both the miniaturization of a module and decrease in mismatching loss due to wiring loss and variation in wiring.

Solutions radio frequency module according to an aspect of the present disclosure includes: a module board; a first electronic component and a second electronic component that are disposed apart from each other on the module board; and a third electronic component that is electrically connected to both the first electronic component and the second electronic component, and is disposed extending across the first electronic component and the second electronic component.

Advantageous Effects

According to the present disclosure, the miniaturization of a radio frequency module and decrease in mismatching loss due to wiring loss and variation in wiring can be both achieved.

BRIEF DESCRIPTION OF DRAWINGS

These and other advantages and features will become apparent from the following description thereof taken in conjunction with the accompanying Drawings, by way of non-limiting examples of embodiments disclosed herein.

DESCRIPTION OF EMBODIMENTS

Figure 1:
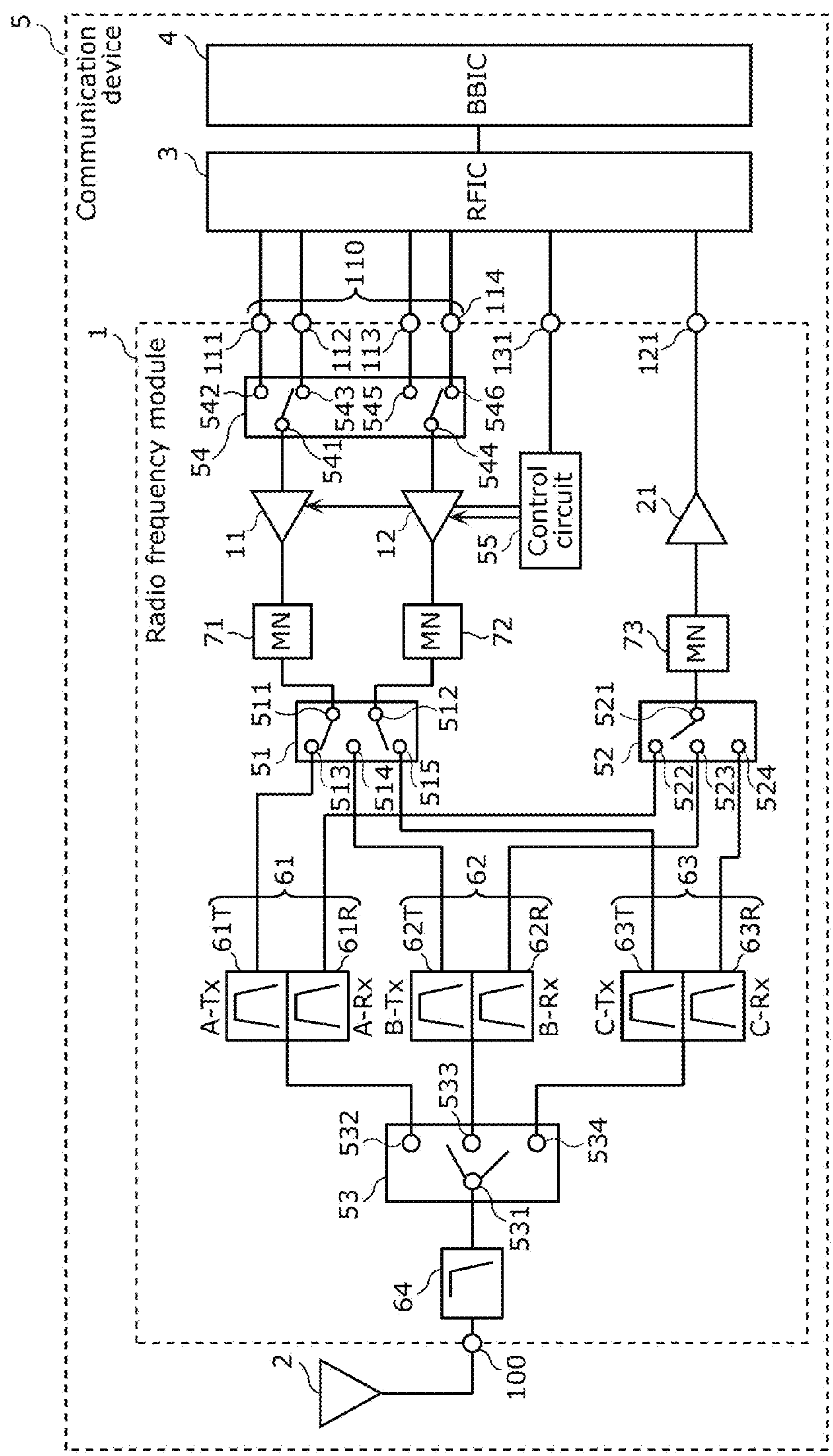
FIG. 1 is a diagram illustrating a circuit configuration of a radio frequency module (or RF front-end circuitry) according to Embodiment 1.

The following describes in detail embodiments of the present disclosure with reference to the drawings. It should be noted that the embodiments described below each show a general or specific example. The numerical values, shapes, materials, elements, and the arrangement and connection of the elements, for instance, described in the embodiments are mere examples, and thus are not intended to limit the present disclosure.

Note that the drawings are each a schematic diagram with emphasis, omission and/or ratio adjustment being made as appropriate in order to illustrate the present disclosure, and thus do not give strictly accurate illustrations. Shapes, positional relationships, and ratios in the drawings may be therefore different from the actual shapes, positional relationships, and ratios. In the drawings, elements which are substantially the same are given the same reference signs, and redundant description is omitted or simplified.

In each of the drawings, the x-axis and y-axis are perpendicular to each other on a plane that is parallel to the principal surfaces of the module board. The z-axis is perpendicular to the principal surfaces of the module board. The positive direction and the negative direction of the z-axis indicate an upward direction and a downward direction, respectively.

In a circuit configuration according to the present disclosure, when it is expressed that an element "is connected" to another element, the expression includes not only the case where the element is directly connected to another element via a connection terminal and/or a line conductor, but also the case where the element is electrically connected to another element via other circuit element. When it is expressed that an element "is connected between A and B", the expression means that the element is connected to both A and B and between A and B.

In the arrangement of components according to the present disclosure, the expression "a component is disposed on a board" refers not only to the state in which the component is disposed in contact with the board, but also to the state in which the component is disposed above the board without contacting the board (e.g., the component is stacked on another component disposed on the board) and to the state in which a part or whole of the component is embedded in the board. The expression "a component is disposed on a principal surface of a board" refers not only to the state in which the component is disposed on the principal surface in contact with the principal surface, but also to the state in which the component is disposed above the principal surface without contacting the principal surface and to the state in which a part of the component is embedded in the board from the principal surface side.

Terms indicating a relation between elements such as "parallel" and "perpendicular" express not only strict meanings, but also substantially identical ranges each including a deviation of about several percent, for example.

Embodiment 1

[1.1 Circuit Configuration of Radio Frequency Module 1 and Communication Device 5]

The following describes a circuit configuration of radio frequency module 1 and communication device 5 with reference to FIG. 1. FIG. 1 is a diagram illustrating the circuit configuration of frequency module 1 and communication device 5 according to Embodiment 1.

[1.1.1 Circuit Configuration of Communication Device 5]

First, a circuit configuration of communication device 5 will be described. As illustrated in FIG. 1, communication device 5 according to this embodiment includes radio frequency module 1, antenna 2, RFIC 3, and BBIC 4. The following describes, one by one, the constituent elements of communication device 5.

Radio frequency module 1 transfers radio frequency signals between antenna 2 and RFIC 3. A circuit configuration of radio frequency module 1 will be described later.

Antenna 2 is connected to antenna connection terminal 100 of radio frequency module 1, receives a radio frequency signal from outside, and outputs the received radio frequency signal to radio frequency module 1.

RFIC 3 is one example of a signal processing circuit that processes radio frequency signals. Specifically, RFIC 3 performs, by down-conversion, etc., signal processing on a radio frequency reception signal that is input via a reception path of radio frequency module 1, and outputs a reception signal generated through the signal processing to BBIC 4. RFIC 3 includes a controller that controls switches and low-noise amplifiers included in radio frequency module 1. Note that part or all of the functions of RFIC3 as the controller may be mounted outside RFIC 3 and may be mounted on, for example, BBIC 4 or radio frequency module 1.

BBIC 4 is a baseband signal processing circuit that processes signals using an intermediate frequency band lower than the frequency band of a radio frequency signal that radio frequency module 1 transfers. A signal processed by BBIC 4 is used, for example, as an image signal for image display and/or an audio signal for talk through a loudspeaker.

It should be noted that antenna 2 and BBIC 4 are optional, and thus not essential elements of communication device 5 according to this embodiment.

[1.1.2 Circuit Configuration of Radio Frequency Module 1]

Next, a circuit configuration of radio frequency module 1 will be described. As illustrated in FIG. 1, radio frequency module 1 includes power amplifiers 11 and 12, low-noise amplifier 21, switches 51 to 54, control circuit 55, duplexers 61 to 63, filter 64, matching circuits (MN) 71 to 73, antenna connection terminal 100, radio frequency input terminals 110, radio frequency output terminal 121, and control terminal 131.

Antenna connection terminal 100 is one example of an external connection terminal and is connected to antenna 2.

Radio frequency input terminals 110 are examples of external connection terminals and are terminals for receiving radio frequency transmission signals from outside radio frequency module 1. In this embodiment, radio frequency input terminals 110 include four radio frequency input terminals 111 to 114.

For example, radio frequency signals for which mutually different communication systems are used and/or radio frequency signals of mutually different communication bands may be used as radio frequency signals received from outside radio frequency input terminals 110.

Communication system refers to a communication system constructed using radio access technology (RAT). In this embodiment, a 5th Generation New Radio (5GNR) system, a Long Term Evolution (LTE) system, or a Wireless Local Area Network (WLAN) system, for instance, may be used as such a communication system, but the communication system according to the present disclosure is not limited to these systems.

Communication band refers to a frequency band that is defined in advance for a communication system by, for instance, a standards organization (for example, 3rd Generation Partnership Project (3GPP), Institute of Electrical and Electronics Engineers (IEEE), etc.).

It should be noted that the number of radio frequency input terminals 110 is not limited to four. The number may be, for example, less than four or more than four.

Radio frequency output terminal 121 is one example of an external connection terminal and is a terminal for providing radio frequency signals to outside radio frequency module 1.

Control terminal 131 is one example of an external connection terminal and is a terminal for receiving control signals from outside radio frequency module 1. Signals for controlling power amplifiers 11 and 12, for example, may be used as such control signals.

Power amplifier 11 is one example of a first power amplifier and is capable of amplifying radio frequency signals received by radio frequency input terminals 110. In this example, power amplifier 11 is capable of amplifying one or more radio frequency signals of communication band A which are input via switch 54 from radio frequency input terminal 111 and/or radio frequency input terminal 112.

Power amplifier 12 is one example of a second power amplifier and is capable of amplifying radio frequency signals received by radio frequency input terminals 110. Specifically, power amplifier 12 is capable of amplifying one or more radio frequency signals of communication band B and/or communication band C which are input via switch 54 from radio frequency input terminal 113 and/or radio frequency input terminal 114.

A configuration of each of power amplifiers 11 and 12 is not specifically limited. For example, power amplifiers 11 and 12 may each be a multi-stage amplifier. In other words, each of power amplifiers 11 and 12 may include cascaded amplifier elements. Note that the number of steps in each of power amplifiers 11 and 12 is not limited to two and may be three or more. Moreover, power amplifier 11 and/or power amplifier 12 may have a single-stage configuration.

Moreover, power amplifier 11 and/or power amplifier 12 may convert a radio frequency signal into a differential signal (i.e., a complementary signal) and then amplify. Such power amplifier 11 and power amplifier 12 may be referred to as differential amplifiers. In this case, power amplifier 11 and/or power amplifier 12 may output a differential signal.

Matching circuit 71 is connected between power amplifier 11 and transmission filter 61T. Specifically, matching circuit 71 is connected between the output of power amplifier 11 and terminal 511 of switch 51. Matching circuit 71 is capable of matching the impedance of power amplifier 11 with the impedance of transmission filter 61T.

Matching circuit 72 is connected between power amplifier 12 and transmission filters 62T and 63T. Specifically, matching circuit 72 is connected between the output of power amplifier 12 and terminal 512 of switch 51. Matching circuit 72 is capable of matching the impedance of power amplifier 12 with the impedances of transmission filters 62T and 63T.

Matching circuit 73 is connected between low-noise amplifier 21 and reception filters 61R to 63R. Specifically, matching circuit 73 is connected between the input of low-noise amplifier 21 and terminal 521 of switch 52. Matching circuit 73 is capable of matching the impedance of low-noise amplifier 21 with the impedances of reception filters 61R to 63R.

Low-noise amplifier 21 is capable of amplifying radio frequency signals received by antenna connection terminal 100. Specifically, low-noise amplifier 21 is capable of amplifying radio frequency signals of communication bands A to C which are input from antenna connection terminal 100 via switch 53, duplexers 61 to 63, and switch 52. The radio frequency signals amplified by low-noise amplifier 21 are output to radio frequency output terminal 121. The configuration of low-noise amplifier 21 is not specifically limited.

Duplexer 61 is one example of a first filter or a fourth filter and has a passband that includes communication band A. Duplexer 61 transfers transmission signals and reception signals of communication band A, using a frequency division duplex (FDD) mode. Duplexer 61 includes transmission filter 61T and reception filter 61R.

Transmission filter 61T is connected between switch 51 and antenna connection terminal 100. Transmission filter 61T passes signals of the transmission band of communication band A among radio frequency transmission signals amplified by power amplifier 11.

Reception filter 61R is connected between switch 52 and antenna connection terminal 100. Reception filter 61R passes signals of the reception band of communication band A among radio frequency reception signals inputted from antenna connection terminal 100.

Duplexer 62 is one example of a second filter and has a passband that includes communication band B different from communication band A. Duplexer 62 transfers transmission signals and reception signals of communication band B, using the FDD mode. Duplexer 62 includes transmission filter 62T and reception filter 62R.

Transmission filter 62T is connected between switch 51 and antenna connection terminal 100. Transmission filter 62T passes signals of the transmission band of communication band B among radio frequency transmission signals amplified by power amplifier 12.

Reception filter 62R is connected between switch 52 and antenna connection terminal 100. Reception filter 62R passes signals of the reception band of communication band B among radio frequency reception signals inputted from antenna connection terminal 100.

Duplexer 63 passes radio frequency signals of communication band C. Duplexer 63 transfers transmission signals and reception signals of communication band C, using the FDD mode. Duplexer 63 includes transmission filter 63T and reception filter 63R.

Transmission filter 63T is connected between switch 51 and antenna connection terminal 100. Transmission filter 63T passes signals of the transmission band of communication band C among radio frequency transmission signals amplified by power amplifier 12.

Reception filter 63R is connected between switch 52 and antenna connection terminal 100. Reception filter 63R passes signals of the reception band of communication band C among radio frequency reception signals inputted from antenna connection terminal 100.

Filter 64 is one example of a third filter and is connected to antenna connection terminal 100. Filter 64 includes a passband including communication bands A, B, and C, and is a low-pass filter, for example.

For example, a communication band that belongs to a high-band group may be used as communication band A. The high-band group is a frequency band group including a plurality of communication bands, is located on the higher frequency side than a middle-band group, and has the frequency range of, for example, from 2.4 GHz to 2.8 GHz. The high-band group includes a communication band of, for example, Band B7 (uplink: from 2500 MHz to 2570 MHz, downlink: from 2620 MHz to 2690 MHz) for the LTE.

For example, a communication band that belongs to a middle-band group may be used as communication band B or C. The middle-band group is a frequency band group including a plurality of communication bands, is located on the lower frequency side than the high-band group, and has the frequency range of, for example, from 1.5 GHz to 2.2 GHz. The middle-band group includes communication bands such as Band B1 (uplink: from 1920 MHz to 1980 MHz, downlink: from 2110 MHz to 2170 MHz), Band B39 (from 1880 MHz to 1920 MHz), and Band B66 (uplink: from 1710 MHz to 1780 MHz, downlink: from 2110 MHz to 2200 MHz) for the LTE.

Switch 51 is one example of a fourth switch and is connected between transmission filters 61T through 63T and power amplifiers 11 and 12. Specifically, switch 51 has terminals 511 to 515. Terminal 511 is connected to the output of power amplifier 11. Terminal 512 is connected to the output of power amplifier 12. Terminals 513 to 515 are connected to transmission filters 61T to 63T, respectively. In this connection configuration, switch 51 is capable of switching between connection and non-connection of terminal 511 to terminal 513 and connecting either terminal 514 or terminal 515 to terminal 512 based on control signals from RFIC 3, for example. In other words, switch 51 switches between connection and non-connection of power amplifier 11 to transmission filter 61T and switches between connection of power amplifier 12 to transmission filter 62T and connection of power amplifier 12 to transmission filter 63T. Switch 51 is configured of, for example, a multi-connection switch circuit and is referred to as a band select switch.

Switch 52 is connected between low-noise amplifier 21 and reception filters 61R to 63R. Specifically, switch 52 includes terminals 521 to 524. Terminal 521 is connected to the input of low-noise amplifier 21. Terminals 522 to 524 are connected to reception filters 61R to 63R, respectively. In this connection configuration, switch 52 is capable of connecting any one of terminals 522 through 524 to terminal 521 based on a control signal from RFIC 3, for example. In other words, switch 52 is capable of switching among the connection of low-noise amplifier 21 to reception filter 61R, the connection of low-noise amplifier 21 to reception filter 62R, and the connection of low-noise amplifier 21 to reception filter 63R. Switch 52 is configured of, for example, a single-pole triple-throw (SP3T) switch circuit and is referred to as an LNA in-switch.

Switch 53 is one example of a first switch, or a second switch, that is connected between antenna connection terminal 100 and duplexers 61 to 63, and is connected between filter 64 and duplexers 61 to 63. Specifically, switch 53 includes terminals 531 to 534. Terminal 531 is connected to antenna connection terminal 100. Terminals 532 to 534 are connected to duplexers 61 to 63, respectively. In this connection configuration, switch 53 is capable of connecting at least one (i.e., one or more) of terminal 532, 533, or 534 to terminal 531 based on a control signal from RFIC 3, for example. In other words, switch 53 is capable of switching between connection and non-connection of antenna 2 to duplexer 61, switching between connection and non-connection of antenna 2 to duplexer 62, and switching between connection and non-connection of antenna 2 to duplexer 63. Switch 53 is configured of, for example, a multi-connection switch circuit and is referred to as an antenna switch.

Switch 54 is one example of a third switch and is connected between radio frequency input terminals 110 and power amplifiers 11 and 12. Specifically, switch 54 includes terminals 541 to 546. Terminal 541 is connected to the input of power amplifier 11. Terminals 542 and 543 are connected to radio frequency input terminals 111 and 112, respectively. Terminal 544 is connected to the input of power amplifier 12. Terminals 545 and 546 are connected to radio frequency input terminals 113 and 114, respectively. In this connection configuration, switch 54 is capable of connecting either terminal 542 or terminal 543 to terminal 541 and connecting either terminal 545 or terminal 546 to terminal 544, based on control signals from RFIC 3, for example. In other words, switch 54 is capable of switching between the connection of radio frequency input terminal 111 to power amplifier 11 and the connection of radio frequency input terminal 112 to power amplifier 11, and switching between the connection of radio frequency input terminal 113 to power amplifier 12 and the connection of radio frequency input terminal 114 to power amplifier 12. Switch 54 is configured of, for example, a multi-connection switch circuit and is referred to as a transmission input switch.

Note that the configuration of switch 54 is not limited to the above example. For example, switch 54 may be a switch that connects either power amplifier 11 or power amplifier x12 to radio frequency input terminal 111. In this case, switch 54 may be configured of a single-pole double-throw (SPDT) switch circuit.

Control circuit 55 is connected to control terminal 131. Control circuit 55 receives a control signal from RFIC 3 via control terminal 131 and outputs the control signal to power amplifiers 11 and 12. Note that control circuit 55 may output the control signal to another circuit component.

Note that some of the circuit elements illustrated in FIG. 1 need not be included in radio frequency module 1. For example, radio frequency module 1 needs to include at least two electronic components (e.g., power amplifiers 11 and 12, duplexers 61 and 62, or duplexer 61 and filter 64) and one electronic component (e.g., control circuit 55 or switch 53) disposed extending across the two electronic components, and does not need to include the other circuit elements.

Although the circuit configuration of radio frequency module 1 allows communication for transferring transmission signals and reception signals using the FDD mode, the circuit configuration of the radio frequency module according to the present disclosure is not limited to that of radio frequency module 1. For example, the radio frequency module according to the present disclosure may have a circuit configuration that allows communication for transferring transmission signals and reception signals using a time division duplex (TDD) mode or a circuit configuration that allows communication using both the FDD mode and the TDD mode.

[1.2 Arrangement of Components in Radio Frequency Module 1]

Next, an arrangement of components in radio frequency module 1 configured as described above will be described in detail with reference to FIG. 2 and FIG. 3.

Figure 2:
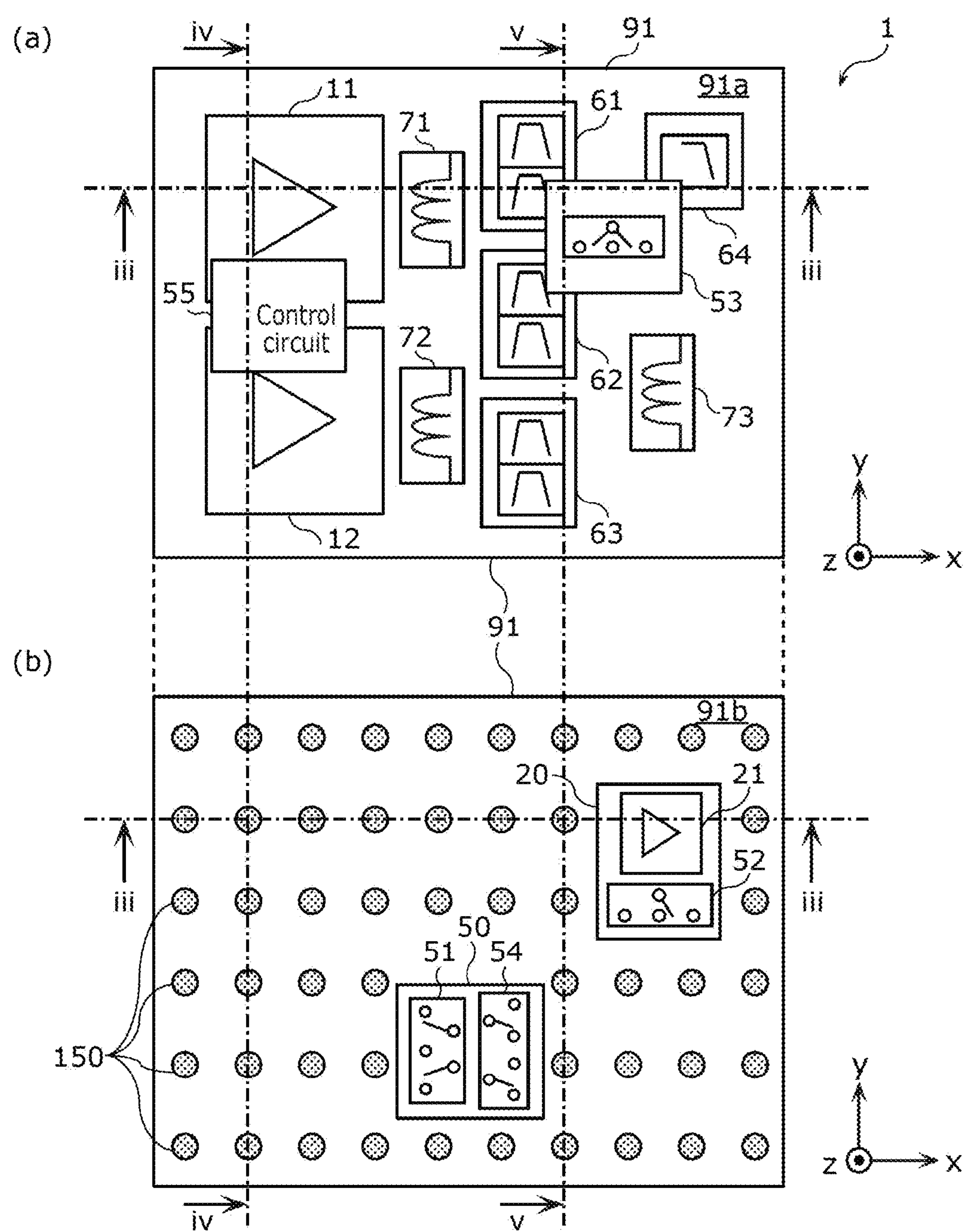
FIG. 2 is a plan view of the radio frequency module according to Embodiment 1.
Figure 3:
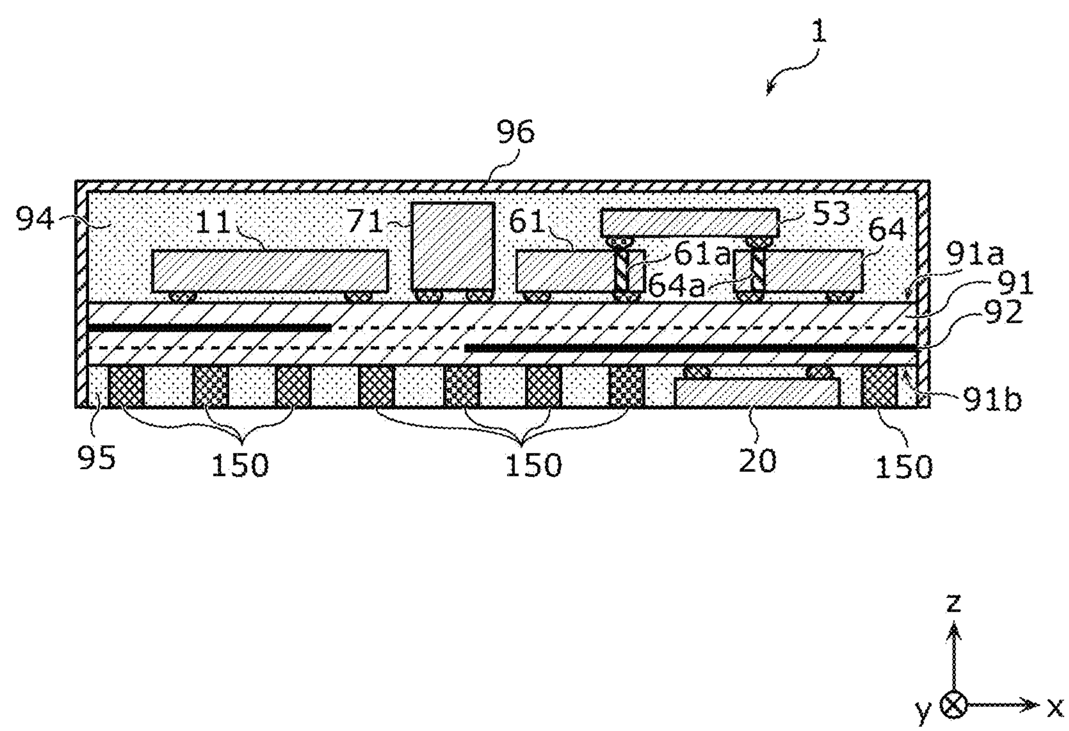
FIG. 3 is a cross-sectional view of the radio frequency module according to Embodiment 1.
Figure 4:
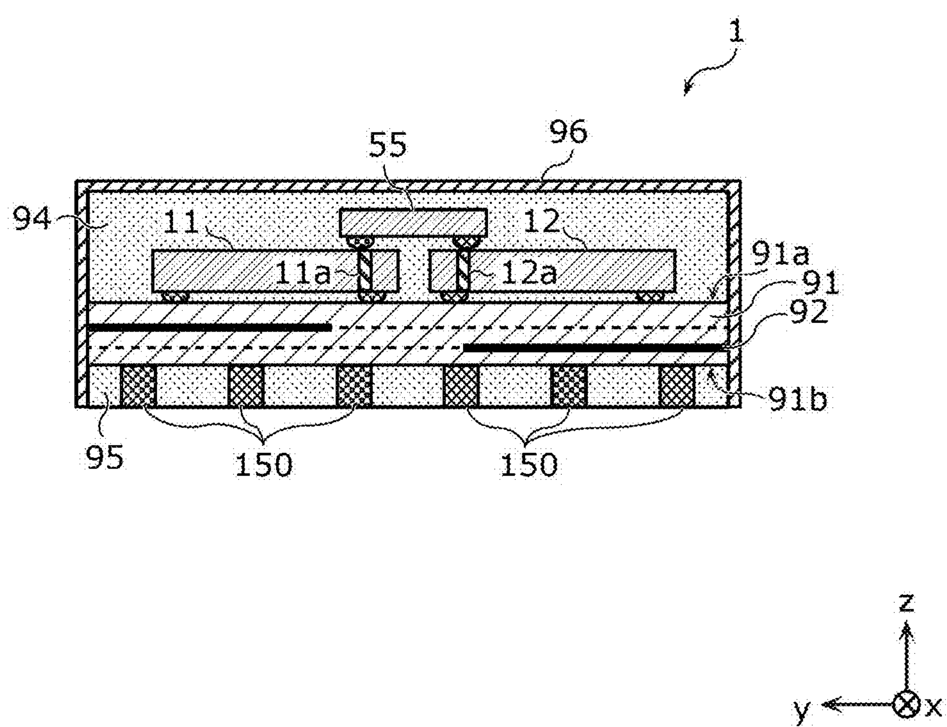
FIG. 4 is a cross-sectional view of the radio frequency module according to Embodiment 1.
Figure 5:
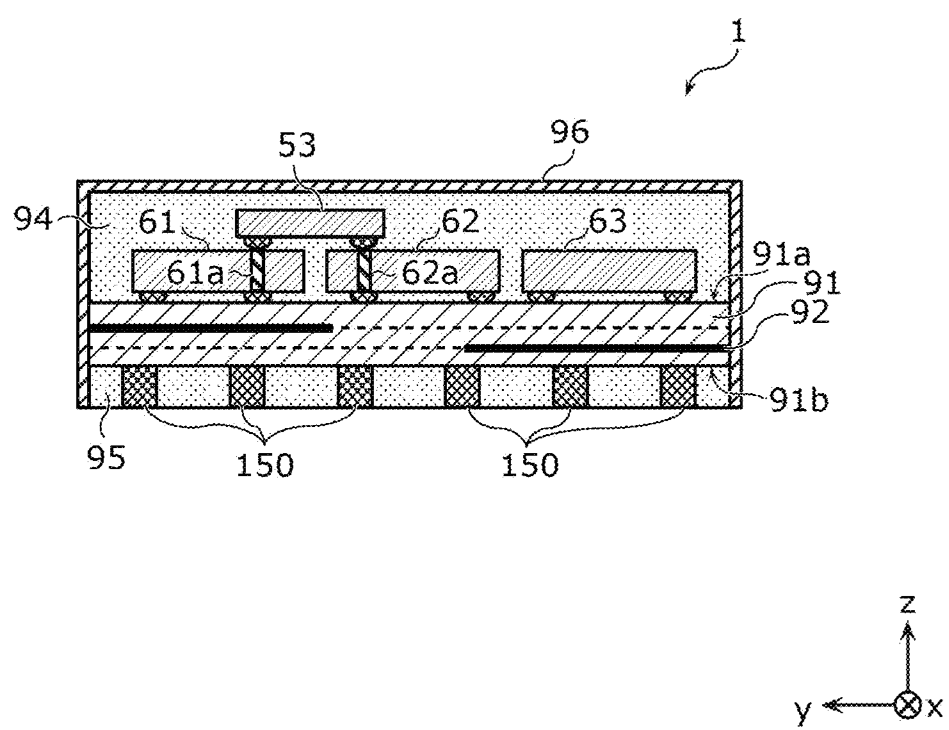
FIG. 5 is a cross-sectional view of the radio frequency module according to Embodiment 1.

FIG. 2 is a plan view of radio frequency module 1 according to Embodiment 1, and has two parts, (a) and (b) that show opposite sides of module board 91. In FIG. 2, (a) shows a view when principal surface 91*a* of module board 91 is viewed from the positive z-axis side, and (b) shows a view when principal surface 91*b* of module board 91 is seen through. FIG. 3 through FIG. 5 are each a cross-sectional view of radio frequency module 1 according to Embodiment 1. The cross-sectional views of radio frequency module 1 in FIG. 3 through FIG. 5 are cross sections taken along the iii-iii line, the iv-iv line, and the v-v line in FIG. 2, respectively.

As illustrated in FIG. 2 through FIG. 5, radio frequency module 1 includes, in addition to the circuit components included in the circuit illustrated in FIG. 1, module board 91, resin components 94 and 95, shield electrode 96, and post electrodes 150. It should be noted that in FIG. 2, illustrations of shield electrode 96 and resin components 94 and 95 are omitted.

Module board 91 includes principal surface 91*a* and principal surface 91*b* disposed on opposite sides of module board 91. For example, a low temperature co-fired ceramics (LTCC) board, a high temperature co-fired ceramics (HTCC) board, a component built-in board, a board that includes a redistribution layer (RDL), a printed circuit board, or the like may be used as module board 91, but the module board according to the present disclosure is not limited to these boards. Ground electrode pattern 92 is formed in module board 91.

Principal surface 91*a* is one example of a first principal surface and may be referred to as a top surface or a surface. On principal surface 91*a*, power amplifiers 11 and 12, switch 53, control circuit 55, duplexers 61 to 63, filter 64, matching circuits 71 to 73, and resin component 94 are disposed, as illustrated in (a) in FIG. 2, for instance.

Switch 53 is one example of the third electronic component, and is disposed extending across filter 64 and duplexers 61 and 62. In this case, any two of filter 64 and duplexers 61 and 62 are examples of the first electronic component and the second electronic component, and are disposed apart from each other. Furthermore, filter 64 and duplexers 61 and 62 are disposed between module board 91 and switch 53. In other words, switch 53 is disposed above and extending across filter 64 and duplexers 61 and 62. In this context, from a plan view, a portion of a footprint of switch 53 overlaps at least a portion of a footprint of filter 64, a second portion of the footprint of switch 53 overlaps at least a portion of a footprint of duplexer 61, and a third portion of the footprint of switch 53 overlaps at least a portion of a footprint of duplexer 62. In a case where switch 53 is above, and extends across only two components (e.g., filter 64 and duplexer 61), then it could be said that switch 53 is disposed above and extending across filter 64 and duplexer 61.

Specifically, switch 53 is stacked partially on filter 64 and duplexers 61 and 62, and bridges over filter 64 and duplexers 61 and 62. Stated differently, a first portion of switch 53 is stacked on duplexer 61, a second portion of switch 53 is stacked on duplexer 62, and a third portion of switch 53 is stacked on filter 64. In this case, the first, second, and third portions of switch 53 are located on the same plane.

Moreover, switch 53 is electrically connected to a component disposed below switch 53 via a via conductor formed in the component. Specifically, switch 53 is electrically connected to duplexer 61 via the via conductor 61*a* formed in duplexer 61. Switch 53 is also electrically connected to duplexer 62 via the via conductor 62*a* formed in duplexer 62. Furthermore, switch 53 is electrically connected to filter 64 via the via conductor 64*a* formed in filter 64.

Via conductor is a conductor filled in a via formed in a component and the material thereof is not specifically limited. Note that the via conductor may be configured of a conductor filled in a through via or may be configured of: two conductors each of which is filled in a blind via; and a planar electrode pattern connecting the conductors in a component.

Control circuit 55, which is optionally a hardware or software programmable circuit, is one example of a third electronic component and is disposed extending across power amplifier 11 and power amplifier 12, as illustrated in FIG. 2. In this case, power amplifiers 11 and 12 are examples of the first electronic component and the second electronic component and are disposed apart from each other. Furthermore, power amplifiers 11 and 12 are disposed between module board 91 and control circuit 55. In other words, control circuit 55 is disposed above and extending across power amplifier 11 and power amplifier 12.

Specifically, control circuit 55 is partially stacked on power amplifiers 11 and 12, and bridges over power amplifiers 11 and 12. Stated differently, a first portion of control circuit 55 is stacked on power amplifier 11 and a second portion of control circuit 55 is stacked on power amplifier 12. In this case, the first portion and the second portion of control circuit 55 are located on the same plane.

Moreover, control circuit 55 is electrically connected to a component disposed below control circuit 55 via a via conductor formed in the component. Specifically, control circuit 55 is electrically connected to power amplifier 11 via the via conductor 11*a* formed in power amplifier 11. Control circuit 55 is also electrically connected to power amplifier 12 via the via conductor 12*a* formed in power amplifier 12.

Duplexers 61 to 63 and filter 64 may each be any one of a surface acoustic wave filter, an acoustic wave filter using bulk acoustic waves (BAWs), an LC resonance filter, or a dielectric filter, and what is more, are not limited to these filters.

Each of matching circuits 71 to 73 includes, for example, an inductor and/or a capacitor and is configured of surface mount device(s) (SMD(s)). Note that matching circuits 71 to 73 may be formed in module board 91 or configured of an integrated passive device (IPD).

Resin component 94 covers the circuit components on principal surface 91*a* and has a function to ensure reliability on, for instance, mechanical strength and moisture resistance of the components on principal surface 91*a*.

Principal surface 91*b* is one example of a second principal surface and may be referred to as a bottom surface or a rear surface. On principal surface 91*b*, semiconductor component 20 having low-noise amplifier 21 and switch 52 built therein, semiconductor component 50 having switches 51 and 54 built therein, resin component 95, and post electrodes 150 are disposed, as illustrated in (b) in FIG. 2, for instance.

Each of semiconductor components 20 and 50 is an electronic component that includes an electronic circuit formed on the surface and inside of a semiconductor chip (also referred to as a die), and that is also referred to as a semiconductor integrated circuit. Semiconductor components 20 and 50 may each be configured using, for example, a complementary metal oxide semiconductor (CMOS) and may be formed by a silicon on insulator (SOI) process, to be specific. Accordingly, the semiconductor components can be manufactured at low cost. It should be noted that semiconductor components 20 and 50 may each include at least one of GaAs, SiGe, or GaN. Accordingly, it is possible to achieve high quality semiconductor components.

Resin component 95 covers the circuit components on principal surface 91*b*. Resin component 95 has a function to ensure reliability on, for instance, mechanical strength and moisture resistance of the components on principal surface 91*b*.

Post electrodes 150 include external connection terminals including radio frequency input terminals 110, radio frequency output terminal 121, and control terminal 131. Post electrodes 150 are each disposed on principal surface 91*b* of module board 91 and vertically extend from principal surface 91*b*. Post electrodes 150 each penetrate resin component 95 and one ends of post electrodes 150 are exposed from resin component 95. The ends of post electrodes 150 exposed from resin component 95 are connected to, for instance, input/output terminals and/or ground electrodes on a motherboard disposed in the positive z-axis direction of radio frequency module 1.

Shield electrode 96 is a metal thin-film formed by, for example, a sputtering method and is formed to cover the top surface and the side surface of resin component 94 and the side surfaces of module board 91 and resin component 95. The potential of shield electrode 96 is set to a ground potential and this prevents external noise from entering the circuit components constituting radio frequency module

[1.3 Advantageous Effects etc.]

As described above, radio frequency module 1 according to this embodiment includes: module board 91; a first electronic component and a second electronic component that are disposed apart from each other on module board 91; and a third electronic component that is electrically connected to both the first electronic component and the second electronic component, and is disposed extending across the first electronic component and the second electronic component.

With this configuration, it is possible to dispose the third electronic component extending across the first electronic component and the second electronic component, and this in turn makes it possible to achieve the miniaturization of radio frequency module 1. In addition, it is possible to shorten both an interconnection length between the first electronic component and the third electronic component and an interconnection length between the second electronic component and the third electronic component. Accordingly, it is possible to reduce wiring loss and/or noise emitted from wiring, thereby enhancing the electrical characteristics (e.g., noise figure (NF), gain characteristics, etc.) of radio frequency module 1.

For example, in radio frequency module 1 according to this embodiment, the first electronic component and the second electronic component may be disposed between module board 91 and the third electronic component.

With this configuration, it is possible to stack the third electronic component on the first electronic component and the second electronic component, thereby stably fixing the third electronic component.

For example, in radio frequency module 1 according to this embodiment, the first electronic component may be duplexer 61 having a passband that includes communication band A, the second electronic component may be duplexer 62 having a passband that includes communication band B different from communication band A, and the third electronic component may be switch 53 connected between (i) antenna connection terminal 100 and (ii) duplexers 61 and 62.

With this configuration, it is possible to shorten both an interconnection length between switch 53 and duplexer 61 and an interconnection length between switch 53 and duplexer 62. Accordingly, it is possible to reduce mismatching loss due to wiring loss and variation in wiring, thereby improving the electrical characteristics of radio frequency module 1. Particularly, when simultaneous communication using communication bands A and B is performed, shortening the interconnection length between switch 53 and duplexer 61 enables reducing mismatching loss due to wiring, thereby improving the quality of signals of communication band A. On the other hand, by shortening the interconnection length between switch 53 and duplexer 62, it is possible to reduce mismatching loss due to wiring, thereby improving the quality of signals of communication band B.

For example, in radio frequency module 1 according to this embodiment, the first electronic component may be filter 64 connected to antenna connection terminal 100, the second electronic component may be duplexer 61 connected to antenna connection terminal 100 via filter 64, and the third electronic component may be switch 53 connected between filter 64 and duplexer 61.

With this configuration, it is possible to shorten both an interconnection length between switch 53 and filter 64 and an interconnection length between switch 53 and duplexer 61. Accordingly, it is possible to reduce mismatching loss due to wiring loss and variation in wiring, thereby enhancing the electrical characteristics of radio frequency module 1.

For example, in radio frequency module 1 according to this embodiment, the first electronic component may be power amplifier 11, the second electronic component may be power amplifier 12, and the third electronic component may be control circuit 55 that controls power amplifier 11 and power amplifier 12.

With this configuration, it is possible to shorten both an interconnection length between control circuit 55 and power amplifier 11 and an interconnection length between control circuit 55 and power amplifier 12. Accordingly, it is possible to reduce noise emitted from wiring, thereby enhancing the electrical characteristics of radio frequency module 1. Particularly, when control circuit 55 outputs a digital signal, it is possible to reduce its digital noise, thereby enhancing the electrical characteristics of radio frequency module 1.

For example, radio frequency module 1 according to this embodiment may also include a fourth electronic component. Module board 91 may include principal surface 91*a* and principal surface 91*b* disposed on opposite sides of module board 1, the first electronic component, the second electronic component, and the third electronic component may be disposed on one of principal surface 91*a* and principal surface 91*b*, and the fourth electronic component may be disposed on the other of principal surface 91*a* and principal surface 91*b*.

With this configuration, it is possible to dispose components on both principal surfaces of module board 91, thereby achieving further miniaturization of radio frequency module 1.

For example, radio frequency module 1 according to this embodiment may also include external connection terminals 150. The first electronic component, the second electronic component, and the third electronic component may be disposed on principal surface 91*a*, and the fourth electronic component and external connection terminals 150 may be disposed on principal surface 91*b*.

With this configuration, it is possible to dispose, on principal surface 91*a* located on a side opposite to the side where post electrodes 150 are provided, the first electronic component, the second electronic component, and the third electronic component for which a lower profile is difficult to achieve due to stacking. Accordingly, it is possible to achieve lowering of post electrodes 150 and the lower profile of the entire radio frequency module 1.

Moreover, communication device 5 according to this embodiment includes RFIC 3 that processes a radio frequency signal; and radio frequency module 1 that transfers the radio frequency signal between RFIC 3 and antenna 2.

According to this configuration, the same effects as those obtained with radio frequency module 1 can be attained in communication device 5.

Embodiment 2

Next, Embodiment 2 will be described. The main difference between this embodiment and the above Embodiment 1 is that when a single electronic component is disposed extending across two electronic components, the single electronic component is disposed inside a cavity in a module board and between the module board and the electronic components. The following describes this embodiment with reference to one of the drawings, focusing on the difference from the above Embodiment 1.

It should be noted that since the circuit configuration of radio frequency module 1A according to this embodiment is the same as that of radio frequency module 1 according to the above Embodiment 1, illustration and description of radio frequency module 1A are omitted.

[2.1 Arrangement of Components in Radio Frequency Module 1A]

Figure 6:
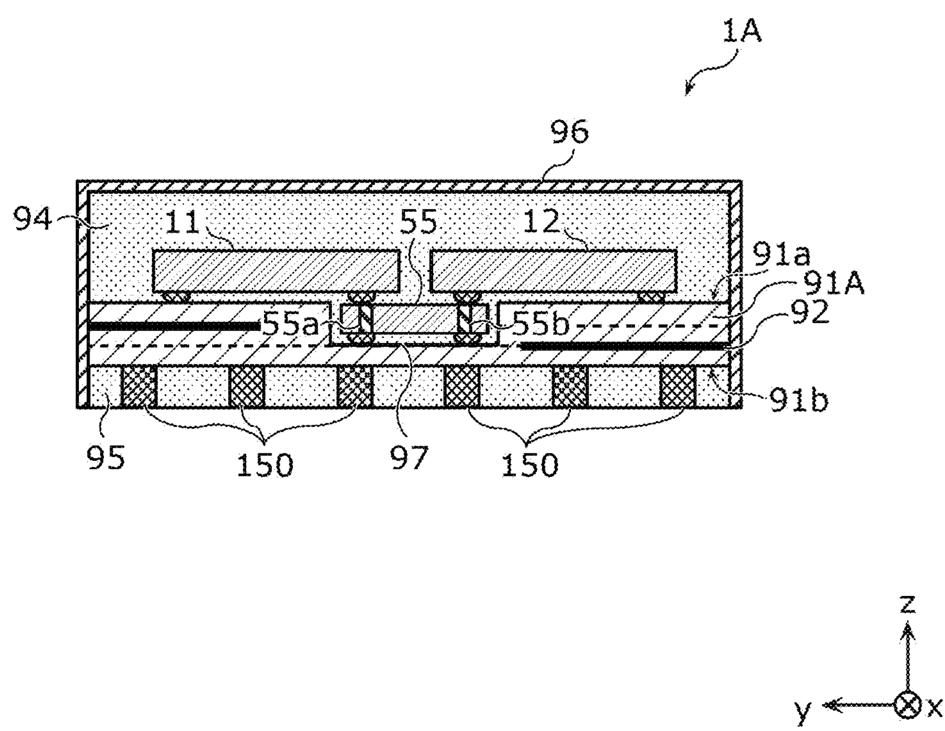
FIG. 6 is a cross-sectional view of a radio frequency module according to Embodiment 2.

An arrangement of components in radio frequency module 1A according to this embodiment will be described in detail with reference to FIG. 6. FIG. 6 is a cross-sectional view of radio frequency module 1A according to Embodiment 2.

In this embodiment, cavity 97 is formed in module board 91A, as illustrated in FIG. 6. Control circuit 55 is disposed in cavity 97. It should be noted that the entirety of or only a portion of control circuit 55 may be disposed in cavity 97. In this context, the entirety of control circuit 55 is disposed in cavity 97 when an uppermost surface of control circuit 55 is coplanar with, or below, a portion of a principle surface of module board 91A that does not include cavity 97.

Control circuit 55 is disposed extending across power amplifier 11 and power amplifier 12. In this case, control circuit 55 is disposed between module board 91A and power amplifiers 11 and 12. In other words, control circuit 55 is disposed below and extending across power amplifier 11 and power amplifier 12.

Specifically, power amplifier 11 is stacked on a first portion of control circuit 55 and power amplifier 12 is stacked on a second portion of control circuit 55. In this case, the first portion and the second portion of control circuit 55 are located on the same plane.

Moreover, control circuit 55 is electrically connected to power amplifier 11 via the via conductor 55*a* formed in control circuit 55, as illustrated in FIG. 6. Control circuit 55 is also electrically connected to power amplifier 12 via the via conductor 55*b* formed in control circuit 55.

[2.2 Advantageous Effects etc.]

As described above, radio frequency module 1A according to this embodiment includes module board 91A, the first electronic component and the second electronic component that are disposed apart from each other on module board 91A, and the third electronic component that is electrically connected to both the first electronic component and the second electronic component and is disposed extending across the first electronic component and the second electronic component. In this case, the third electronic component may be disposed between module board 91A and the first and second electronic components.

With this configuration, it is also possible to stack the first electronic component and the second electronic component on the third electronic component.

For example, in radio frequency module 1A according to this embodiment, module board 91A may include cavity 97, and at least a portion of the third electronic component may be disposed in cavity 97.

With this configuration, it is possible to achieve the lower profile of a group of components, that is, the first electronic component, the second electronic component, and the third electronic component that are stacked. In addition, it is possible to bring the first electronic component and the second electronic component, which are disposed above the third electronic component, closer to principal surface 91*a* of module board 91A, thereby facilitating mounting of the first electronic component and the second electronic component onto principal surface 91*a* of module board 91A.

Although this embodiment has described the component arrangement of control circuit 55 and power amplifiers 11 and 12, the same component arrangement can be applied also to switch 53, duplexers 61 and 62, and filter 64. In other words, switch 53 may be disposed in a cavity and between (i) module board 91A and (ii) filter 64 and duplexers 61 and 62.

Variation of Embodiment 2

Next, a variation of Embodiment 2 will be described. The main difference between this variation and the above Embodiment 2 is that when a single electronic component is disposed extending across electronic components, the single electronic component is disposed not in a cavity but on a principal surface of the module board. The following describes this variation with reference to one of the drawings, focusing on the difference from the above Embodiment 2.

[3.1 Arrangement of Components in Radio Frequency Module 1B]

Figure 7:
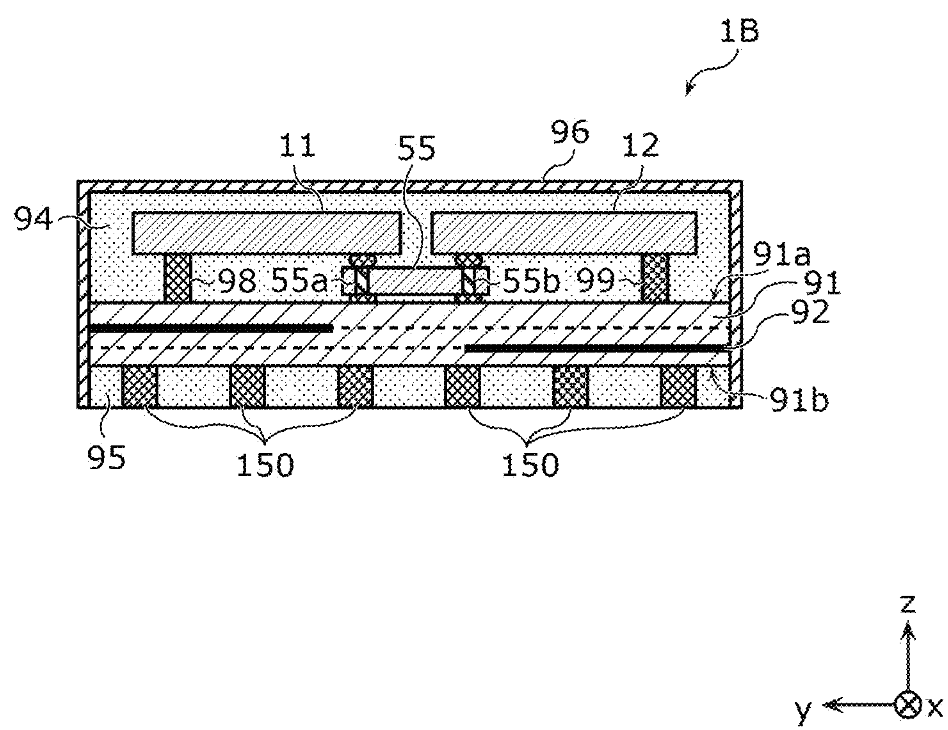
FIG. 7 is a cross-sectional view of a radio frequency module according to a variation of Embodiment 2.

An arrangement of components in radio frequency module 1B according to this variation will be described in detail with reference to FIG. 7. FIG. 7 is a cross-sectional view of radio frequency module 1B according to the variation of Embodiment 2.

As illustrated in FIG. 7, control circuit 55 according to this variation is disposed extending across power amplifier 11 and power amplifier 12 and between module board 91 and power amplifiers 11 and 12, as is the case described in Embodiment 2. In other words, control circuit 55 is disposed below and extending across power amplifiers 11 and 12.

In this variation, however, control circuit 55 is disposed on principal surface 91*a* of module board 91. In addition, post electrode 98 extending from power amplifier 11 to module board 91 and post electrode 99 extending from power amplifier 12 to module board 91 are provided.

Post electrode 98 is one example of a first electrode. Post electrode 98 extends, to module board 91, from the bottom surface of power amplifier 11 which does not overlap control circuit 55 in the plan view of module board 91. The potential of post electrode 98 is set to, for example, a ground potential and post electrode 98 is used as a heat dissipation electrode for power amplifier 11. Moreover, post electrode 98 may be used as an electrode for transferring radio frequency signals.

Post electrode 99 is one example of a second electrode. Post electrode 99 extends, to module board 91, from the bottom surface of power amplifier 12 which does not overlap control circuit 55 in the plan view of module board 91. The potential of post electrode 99 is set to, for example, a ground potential and electrode 99 is used as a heat dissipation electrode for power amplifier 12. Moreover, post electrode 99 may be used as an electrode for transferring radio frequency signals.

[3.2 Advantageous Effects etc.]

As described above, radio frequency module 1B according to this embodiment may further include post electrode 98 extending from the first electronic component to module board 91 and post electrode 99 extending from the second electronic component to module board 91.

With this configuration, it is possible to connect the first electronic component and the second electronic component to module board 91 via post electrodes 98 and 99, thereby stably fixing the first electronic component and the second electronic component to module board 91. In addition, it is also possible to cause post electrodes 98 and 99 to function as heat dissipation paths when the first electronic component and the second electronic component radiate heat.

Although this embodiment has described the component arrangement of control circuit 55 and power amplifiers 11 and 12, the same component arrangement can be applied also to switch 53, duplexers 61 and 62, and filter 64. In other words, switch 53 may be disposed between (i) module board 91 and (ii) filter 64 and duplexers 61 and 62, and post electrodes extending from filter 64 and duplexers 61 and 62 to module board 91 may be provided.

Other Embodiments

The radio frequency module and the communication device according to the present disclosure have been described above based on the embodiments and variations thereof, but are not limited to the embodiments and the variations. The present disclosure also encompasses other embodiments achieved by combining arbitrary elements in the embodiments and variations thereof, variations resulting from various modifications to the embodiments and variations thereof that may be conceived by those skilled in the art without departing from the essence of the present disclosure, and various devices that include the radio frequency module and the communication device described above.

For example, in the radio frequency module and the communication device according to the respective embodiments and variations thereof, another circuit element or another line, for instance, may be inserted in any one of the paths connecting circuit elements and signal paths illustrated in the drawings. For example, a matching circuit may be connected between switch 53 and at least one of duplexers 61, 62, or 63.

In the above embodiments, combinations of the first electronic component, the second electronic component, and the third electronic component disposed extending across the first electronic component and the second electronic component have been exemplified as follows: a combination of power amplifiers 11 and 12 and control circuit 55; a combination of duplexers 61 and 62 and switch 53; and a combination of duplexer 61, filter 64, and switch 53, but are not limited to these combinations. For example, the first electronic component may be power amplifier 11, the second electronic component may be power amplifier 12, and the third electronic component may be either switch 51 or switch 54. Even in this case, it is possible to shorten both an interconnection length between switch 51 or switch 54 and power amplifier 11 and an interconnection length between switch 51 or switch 54 and power amplifier 12, thereby enhancing the electrical characteristics of the radio frequency module.

In each of the above embodiments, electrical components, which are stacked one on top of the other, are connected to each other via a via conductor formed in the lower electronic component, but are not limited to this example. For example, the stacked components may be connected to each other via a bonding wire or a side wire formed on the side surface of the lower electronic component. Even in such a case, it is possible to shorten an interconnection length between the two electronic components.

Note that in each of the above embodiments, the module board is described as a double-sided board, but is not limited to such an example. The module board may be, for example, a single-sided board.

Figure 8:
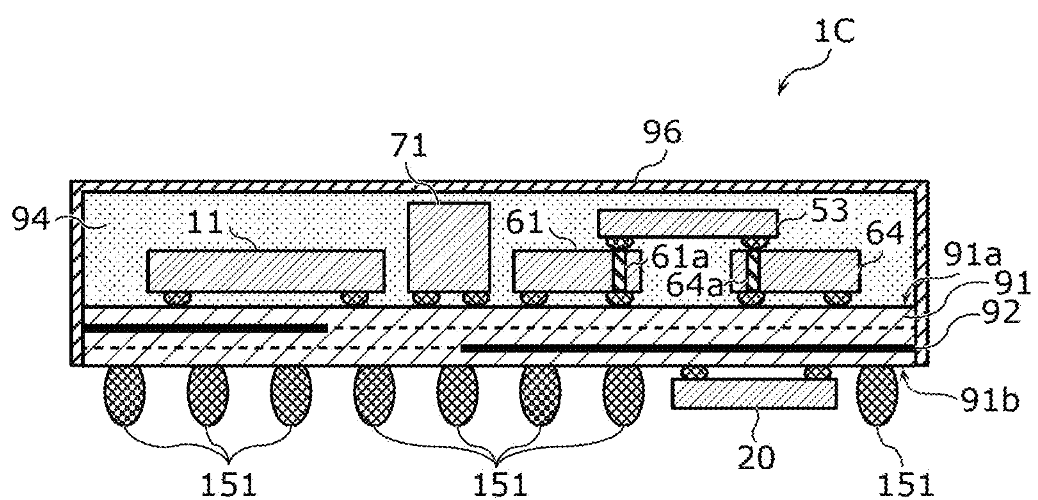
FIG. 8 is a cross-sectional view of a radio frequency module according to another embodiment.

Note that in each of the above embodiments, the external connection terminals include post electrodes 150, but are not limited to such an example. The external connection terminals may include, for example, bump electrodes. FIG. 8 is a cross-sectional view of a radio frequency module IC according to another embodiment. The radio frequency module IC includes bump electrodes 151 instead of post electrodes 150. In this case, the radio frequency module IC does not need to include resin component 95 covering circuit components on principal surface 91*b*.

INDUSTRIAL APPLICABILITY

The present disclosure can be widely used in communication apparatuses such as mobile phones, as a radio frequency module disposed in a front-end section.

The invention claimed is:

1. A radio frequency module, comprising:

a module board having a first surface and a second surface opposite to the first surface;

a first electronic component and a second electronic component that are disposed apart from each other by a gap and that are on one of the first surface or the second surface of the module board, wherein at least the gap is filled with a resin; and a third electronic component also on the one of the first surface or the second surface of the module board, and that is electrically connected to both the first electronic component and the second electronic component, wherein a first portion of the third electronic component overlaps a portion of the first electronic component closest to the gap filled with resin and a second portion of the third electronic component overlaps a portion of the second electronic component closest to the gap filled with resin, wherein the portion of the first electronic component and the portion of the second electronic component are disposed between the module board and the third electronic component, and wherein the radio frequency module further includes a first electrode extending from the first portion of the third electronic component through the portion of the first electronic component to the module board, and a second electrode extending from the second portion of the third electronic component through the portion of the second electronic component to the module board.

2. The radio frequency module according to claim 1, wherein the first electronic component is a first filter having a first passband, the second electronic component is a second filter having a second passband different from the first passband, and the third electronic component is a first switch connected between (i) an antenna connection terminal and (ii) the first filter and the second filter.

3. The radio frequency module according to claim 1, wherein the first electronic component is a third filter connected to an antenna connection terminal, the second electronic component is a fourth filter connected to the antenna connection terminal via the third filter, and the third electronic component is a second switch connected between the third filter and the fourth filter.

4. The radio frequency module according to claim 1, wherein the first electronic component is a first power amplifier, the second electronic component is a second power amplifier, and the third electronic component is a control circuit configured to control the first power amplifier and the second power amplifier.

5. The radio frequency module according to claim 1, wherein the first electronic component is a first power amplifier, the second electronic component is a second power amplifier, and the third electronic component is a third switch connected between (i) at least one radio frequency input terminal and (ii) the first power amplifier and the second power amplifier.

6. The radio frequency module according to claim 1, further comprising:

a first filter having a first passband; and a second filter having a second passband different from the first passband, wherein the first electronic component is a first power amplifier, the second electronic component is a second power amplifier, and the third electronic component is a fourth switch connected between (i) the first filter and the second filter and (ii) the first power amplifier and the second power amplifier.

7. The radio frequency module according to claim 1, further comprising:

a fourth electronic component, wherein the module board includes a first surface and a second principal disposed on opposite sides of the module board, the first electronic component, the second electronic component, and the third electronic component are disposed on or above one of the first surface or the second surface, and the fourth electronic component is disposed on or under the other of the first surface or the second surface.

8. A communication device, comprising:

a signal processing circuit configured to process a radio frequency signal; and the radio frequency module of claim 7, wherein the radio frequency module is configured to transfer the radio frequency signal between the signal processing circuit and an antenna.

9. A communication device, comprising:

a signal processing circuit configured to process a radio frequency signal; and the radio frequency module of claim 1, wherein the radio frequency module is configured to transfer the radio frequency signal between the signal processing circuit and an antenna.

10. The radio frequency module according to claim 1, further comprising:

a shield electrode that connects to the module board to form a space that encompasses the first through third electronic components and the first and second electrodes, wherein the resin envelopes the first through third electronic components and the first and second electrodes.

11. The radio frequency module according to claim 1, wherein the first portion of the third electronic component does not touch the portion of the first electronic component closest to the gap filled with resin, and wherein the second portion of the third electronic component does not touch the portion of the second electronic component closest to the gap filled with resin.

12. A radio frequency module, comprising:

a module board having a first surface and a second surface opposite to the first surface;

a first electronic component and a second electronic component that are disposed apart from each other by a gap and that are on one of the first surface or the second surface of the module board, wherein at least the gap is filled with a resin; and a third electronic component also on the one of the first surface or the second surface of the module board, and that is electrically connected to both the first electronic component and the second electronic component, wherein a first portion of the third electronic component underlies a portion of the first electronic component closest to the gap filled with resin and a second portion of the third electronic component underlies a portion of the second electronic component closest to the gap filled with resin such that the third electronic component is disposed between (i) the module board and (ii) the portion of the first electronic component and the portion of the second electronic component, and the radio frequency module further includes a first electrode extending from the portion of the first electronic component through the first portion of the third electronic component to the module board, and a second electrode extending from the portion of the second electronic component through the second portion of the third electronic component to the module board.

13. The radio frequency module according to claim 12, wherein the module board includes a cavity, and the third electronic component is disposed in the cavity.

14. The radio frequency module according to claim 13, wherein the first electronic component is a first filter having a first passband, the second electronic component is a second filter having a second passband different from the first passband, and the third electronic component is a first switch connected between (i) an antenna connection terminal and (ii) the first filter and the second filter.

15. The radio frequency module according to claim 13, wherein the first electronic component is a third filter connected to an antenna connection terminal, the second electronic component is a fourth filter connected to the antenna connection terminal via the third filter, and the third electronic component is a second switch connected between the third filter and the fourth filter.

16. The radio frequency module according to claim 13, wherein the first electronic component is a first power amplifier, the second electronic component is a second power amplifier, and the third electronic component is a control circuit configured to control the first power amplifier and the second power amplifier.

17. The radio frequency module according to claim 13, wherein the first electronic component is a first power amplifier, the second electronic component is a second power amplifier, and the third electronic component is a third switch connected between (i) at least one radio frequency input terminal and (ii) the first power amplifier and the second power amplifier.

18. The radio frequency module according to claim 13, further comprising:

a first filter having a first passband; and a second filter having a second passband different from the first passband, wherein the first electronic component is a first power amplifier, the second electronic component is a second power amplifier, and the third electronic component is a fourth switch connected between (i) the first filter and the second filter and (ii) the first power amplifier and the second power amplifier.

19. The radio frequency module according to claim 12, further comprising:

a shield electrode that connects to the module board to form a space that encompasses the first through third electronic components and the first and second electrodes, wherein the resin envelopes the first through third electronic components and the first and second electrodes.

20. The radio frequency module according to claim 12, wherein the first portion of the third electronic component does not touch the portion of the first electronic component closest to the gap filled with resin, and wherein the second portion of the third electronic component does not touch the portion of the second electronic component closest to the gap filled with resin.

* * * * *